United States Patent [19]
Murasawa et al.

[11] Patent Number: 5,715,801
[45] Date of Patent: Feb. 10, 1998

[54] IGNITION SYSTEM FOR INTERNAL COMBUSTION ENGINE

[75] Inventors: Naoki Murasawa; Sumitaka Ogawa; Mutsumi Katayama, all of Saitama, Japan

[73] Assignee: Honda Giken Kogyo Kabushiki Kaisha, Tokyo, Japan

[21] Appl. No.: 605,208

[22] PCT Filed: Dec. 7, 1995

[86] PCT No.: PCT/JP95/02507

§ 371 Date: Aug. 29, 1996

§ 102(e) Date: Aug. 29, 1996

[87] PCT Pub. No.: WO96/21105

PCT Pub. Date: Jul. 11, 1996

[30] Foreign Application Priority Data

Dec. 29, 1994 [JP] Japan ............ 6-339885
Oct. 23, 1995 [JP] Japan ............ 7-274591

[51] Int. Cl.$^6$ ............................................ F02P 3/12
[52] U.S. Cl. ................... 123/642; 315/55; 315/209 PZ
[58] Field of Search ....................... 123/143 C, 642; 315/55, 209 R, 209 PZ

[56] References Cited

U.S. PATENT DOCUMENTS

| | | | |
|---|---|---|---|
| 2,461,098 | 2/1949 | Weatherly | 315/57 |
| 3,173,055 | 3/1965 | Harkness | 314/209 PZ |
| 4,412,151 | 10/1983 | Norris | 123/642 |
| 4,767,967 | 8/1988 | Tanaka et al. | 315/209 PZ X |
| 5,128,646 | 7/1992 | Suzuki et al. | 336/110 |
| 5,144,935 | 9/1992 | Taruya et al. | 123/633 |
| 5,146,906 | 9/1992 | Agatsuma | 123/634 |

FOREIGN PATENT DOCUMENTS

| | | |
|---|---|---|
| 58-34722 | 7/1983 | Japan . |
| 60-190672 | 9/1985 | Japan . |
| 62-33408 | 2/1987 | Japan . |
| 62-186062 | 8/1987 | Japan . |
| 63-314366 | 12/1988 | Japan . |
| 1-152072 | 10/1989 | Japan . |

*Primary Examiner*—Tony M. Argenbright
*Attorney, Agent, or Firm*—Birch, Stewart, Kolasch & Birch, LLP

[57] ABSTRACT

A booster is constructed with a piezoelectric transducer including a combination of a primary side piezoelectric element and a secondary side piezoelectric element wherein input electrodes and an output electrode are provided in the thickness direction and length direction, respectively. The booster is contained in a plug cap. The plug cap covers one end of a spark plug. Using this arrangement, a primary voltage having a natural resonance frequency of the piezoelectric element or a waveform identical to a component waveform thereof is applied from a primary voltage generator to the input electrodes. At this time, the booster directly imparts a secondary high voltage from the output electrode to the spark plug by the piezoelectric effect, to generate a spark discharge in a discharge gap of the spark plug. This ignition system can be made smaller in size and weight at a low manufacturing cost.

13 Claims, 11 Drawing Sheets

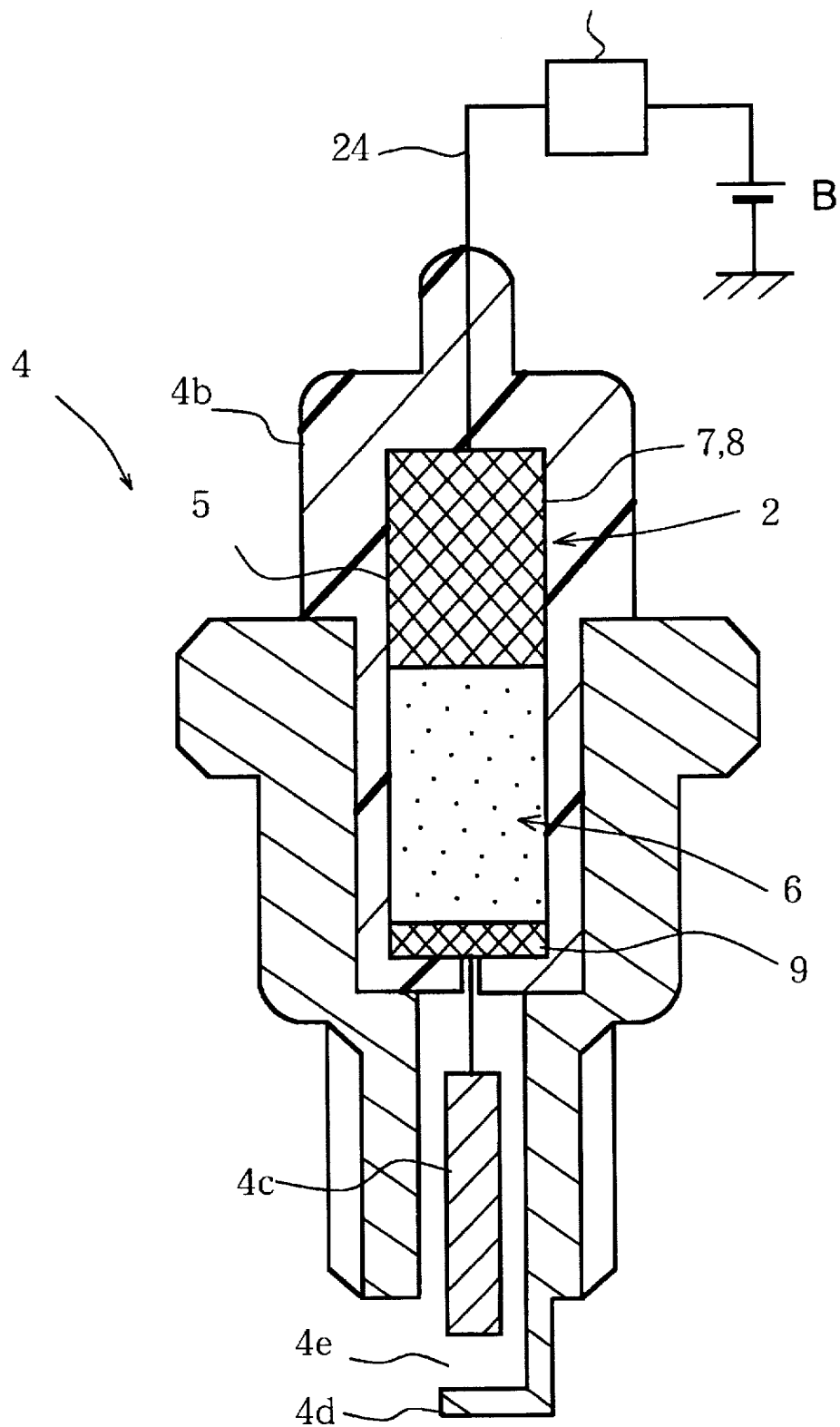

IGNITION SYSTEM FOR INTERNAL COMBUSTION ENGINE

TECHNICAL FIELD

The present invention relates to a compact and lightweight ignition system for an internal combustion engine.

BACKGROUND ART

Japanese Patent Laid-open No. Sho 63-314366 discloses an ignition system for an internal combustion engine in which a high voltage is generated by applying a mechanical pressure to a piezoelectric element. Japanese Patent Publication No. Sho 58-34722 discloses an ignition system in which such a piezoelectric element is combined in series with a booster coil.

Japanese Patent Laid-open No. Sho 62-33408 discloses an ignition system in which an ignition coil is integrated with a plug cap; and Japanese Patent Laid-open No. Hei 4-143461 discloses a similar ignition system used for a double overhead camshaft (DOHC) type engine including a pair of camshafts provided on a cylinder head, in which a plug cap is inserted in a plug hole obliquely formed between the camshafts.

U.S. Pat. No. 2,461,098 discloses an ignition system in which an ignition coil is integrated with a spark plug.

Japanese Patent Laid-open No. Sho 60-190672 discloses a CDI type ignition circuit for generating a secondary voltage using discharge of an ignition capacitor.

The above system using the piezoelectric element, however, has a disadvantage. Namely, the system requires a mechanical pressing means, and also a distributor and a high tension cord for carrying a high voltage, and thereby the entire system is made larger in size and weight and is also complicated in structure, resulting in increased cost.

The above system using the ignition coil is also inevitably made larger in size and weight. Moreover, the system having the ignition coil integrated with the plug cap is made larger in size and is further accompanied by heat generation, so that it has a difficulty in the layout for direct mounting on a small sized internal combustion engine for a motor-bicycle.

In particular, when the system including the plug cap integrated with the ignition coil is used for a DOHC type engine, an ignition coil portion can be disposed between the camshafts and thereby the plug cap can be disposed not to protrude from a cam cover so much only in such a limited condition that a valve included angle is large and an interval between the camshafts is wide; however, in this case, the ignition coil is exposed to high-temperature heat of an engine.

On the other hand, in the case where the valve included angle is small and the interval between the camshafts is narrow, the ignition coil portion is difficult to dispose between the camshafts, and thereby the plug cap tends to largely protrude from the cam cover to the outside, leading to a difficulty in the layout of the engine.

In addition, the use of a piezoelectric element as a booster of an ignition circuit requires a special and advantageous primary voltage generating means for applying a primary voltage to the piezoelectric element.

An object of the present invention, therefore, is to solve the above-described problems.

DISCLOSURE OF THE INVENTION

To achieve the above object, according to the present invention, there is provided an ignition system for an internal combustion engine, characterized in that a booster is provided, which is composed of a piezoelectric transducer for generating a secondary high voltage by an electrostrictive effect of a piezoelectric element applied with a primary voltage; and a primary voltage generating means is provided to generate a primary voltage for vibrating the piezoelectric element at its natural resonance frequency.

In this system, the booster is composed of the piezoelectric transducer capable of outputting a secondary high voltage on the basis of a primary voltage. Accordingly, electrical input as well as electrical output can be performed in spite of using the piezoelectric element, to thereby eliminate the necessity of provision of a mechanical pressing means as a conventional input means and a distribution mechanism.

As a result, the system can be made smaller in size and weight as a whole, and thereby it can be mounted in a simple layout even on a small sized internal combustion engine for a motor-bicycle; and further the system can be optimized in structure for electronic control because an electrical input is provided instead of the conventional mechanical input.

In the system, the booster can be integrally disposed in a plug cap. With this configuration, it is possible to further reduce the size and weight of the entire system with a simple structure, and to eliminate the conventional high tension cord for carrying a high voltage from a conventional distribution mechanism to the spark plug, with the reduced cost. In this system, the plug cap may be made of an insulating material excellent in heat resistance and elasticity. With this configuration, even when the plug cap in the plug hole is exposed to high-temperature heat and vibration of an engine, the booster can be effectively protected from the high-temperature heat and vibration.

In the system, on the other hand, the plug cap can be inserted in a plug hole formed between a pair of parallel camshafts in a DOHC type internal combustion engine and can be mounted in the plug hole in such a manner as not to protrude from a cam cover to the outside. Specifically, according to the present invention, the plug cap being sufficiently small can be compactly contained in the cam cover in such a manner as not to protrude to the outside therefrom even when the system is mounted on the DOHC type engine.

In other words, the small sized plug cap can be sufficiently inserted and mounted, without a limitation in layout of the engine, even in the plug hole which is relatively small in diameter because of the small valve included angle and the narrow interval between a pair of the camshafts.

In the system, the booster can be integrally disposed in the spark plug. With this configuration, it is possible to eliminate the necessity of provision of the plug cap, and hence to further reduce the size and weight of the entire system with a simple structure.

In the system, the primary voltage generating means can include an oscillation circuit connected to a power supply, and a switching element connected in series between the oscillation circuit and the primary side of the booster and turned on/off by an ignition timing determining circuit; and an output frequency of the oscillation circuit can be specified to correspond to the natural resonance frequency of the piezoelectric element. With this configuration, the existing oscillation circuit portion for obtaining a specified primary voltage by boosting a battery power supply using a DC-DC converter in the so-called CDI ignition circuit can be used as the oscillation circuit of the primary voltage generating means.

In the system, the primary voltage generating means can include an oscillation circuit connected in series between a power supply and the primary side of the booster and adapted to generate a frequency corresponding to the natural resonance frequency of the piezoelectric element constituting the booster; and an ignition timing determining circuit for imparting, to the oscillation circuit, an oscillation signal for generating oscillation at a specified timing for a specified time. With this configuration, the oscillation circuit for generating a frequency corresponding to the natural resonance frequency of the piezoelectric element can be directly oscillated at a specified timing for a specified time by the ignition timing determining circuit, and accordingly the structure of the system can be further simplified.

In the system, the primary voltage generating means can include an ignition capacitor connected to a power supply, a booster connected in parallel to the ignition capacitor, and a switching element provided in a discharge circuit of the ignition capacitor and turned on/off by an ignition timing determining circuit; and a time constant for determining a falling waveform of a voltage upon discharge in the discharge circuit of the ignition capacitor can be determined in such a manner that the falling waveform corresponds to a component waveform of the natural resonance frequency of the piezoelectric element. With this configuration, it is possible to omit the oscillation circuit and hence to eliminate the necessity of keeping a stability of frequency in the oscillation circuit. Moreover, since a booster can be used as a capacitor, and thereby the ignition capacitor can be made smaller. In addition, since the thyrister can be used as a switching element, an ignition signal can be supplied in the form of a pulse signal, and thereby a conventional pulser circuit can be used as the ignition timing determining circuit, resulting in reduced cost.

In the system, the primary voltage generating means can include an ignition capacitor connected to a power supply, a switching element forming a discharge circuit of the ignition capacitor and turned on/off by an ignition timing determining circuit, and a booster connected in series between the switching element and a ground terminal; and a time constant for determining a rising waveform of a primary voltage generated on the primary side of the booster upon discharge of the ignition capacitor can be determined in such a manner that the rising waveform corresponds to a component waveform of the natural resonance frequency of the piezoelectric element. With this configuration, the use of mechanical vibration for the piezoelectric element can be made easy as compared with the case of using the above attenuated vibration.

In the system, the primary voltage generating means can include a switching element connected to a power supply and turned on/off by an ignition timing determining circuit, and a booster connected in parallel between two opened/closed terminals of the switching element; and a time constant for determining a rising waveform of a voltage between the two terminals when the switching element is turned off can be determined in such a manner that the rising waveform corresponds to a component waveform of the natural resonance frequency of the piezoelectric element. With this circuit, the basic configuration of a popular battery ignition circuit can be used.

BRIEF DESCRIPTION OF DRAWINGS

FIG. 4 is a view showing the conception of another embodiment;

BEST MODE FOR CARRYING OUT THE INVENTION

Figure 1:
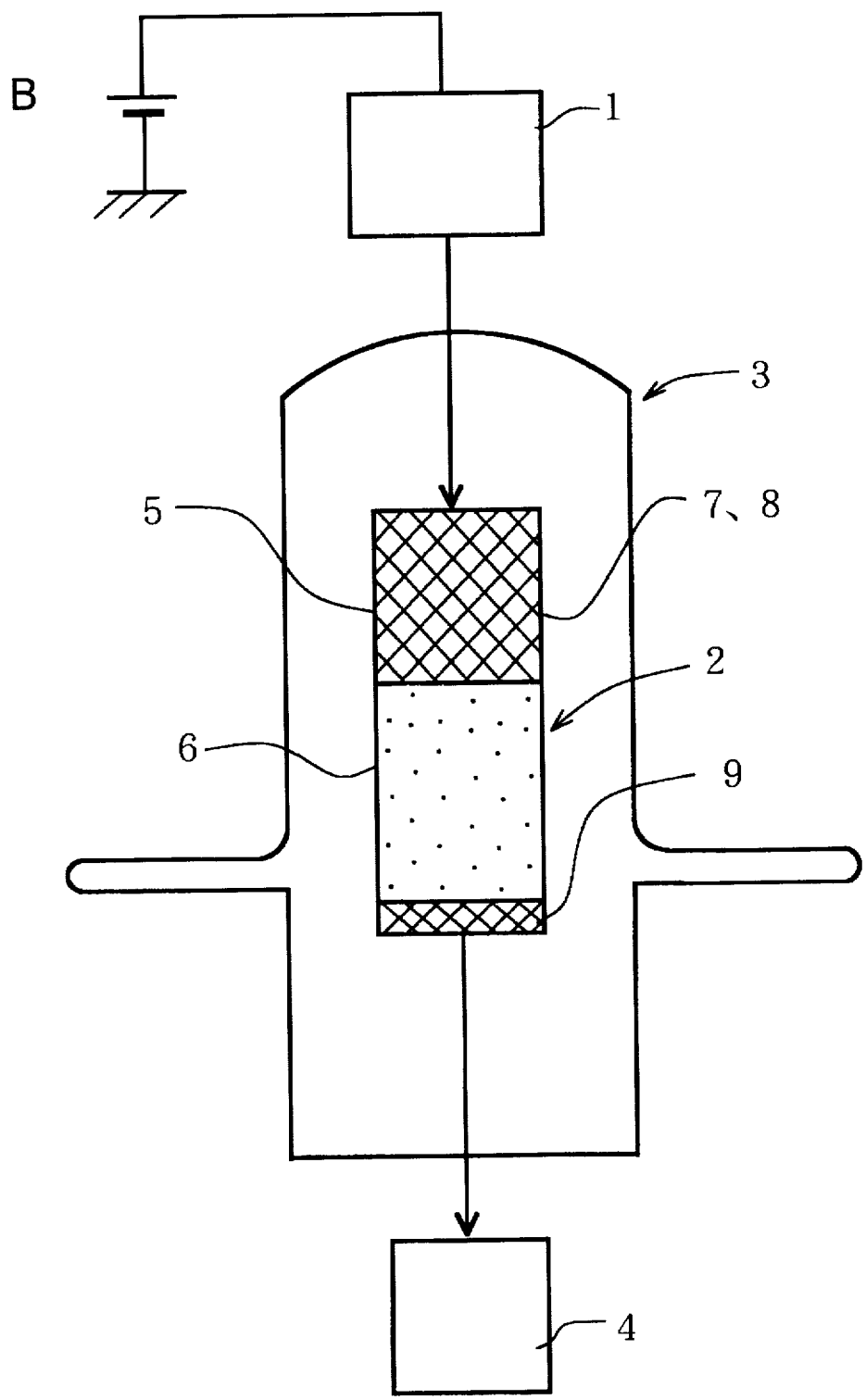
FIG. 1 is a view illustrating the conception of an embodiment.

One embodiment of a plug cap/booster integral type ignition system of the present invention will be described with reference to FIGS. 1 to 3. FIG. 1 is a view illustrating the conception of the embodiment of the ignition system for a motor-bicycle. The ignition system includes a primary voltage generator 1 connected to a suitable power supply such as an on-board battery B; a plug cap 3 containing a booster 2; and a known spark plug 4 covered with the plug cap 3.

The booster 2 is a piezoelectric transducer including a combination of a primary side piezoelectric element 5 and a secondary side piezoelectric element 6, each of which is made of a flat piezoelectric ceramic material. Input electrodes 7, 8 are provided to the primary side piezoelectric element 5, and an output electrode 9 is provided to the secondary side piezoelectric element 6.

The output electrode 9 is conducted to the spark plug 4 when the spark plug 4 is covered with the plug cap 3, so that a spark discharge is generated in a discharge gap of the spark plug 4 by a secondary voltage from the output electrode 9.

Figure 2:
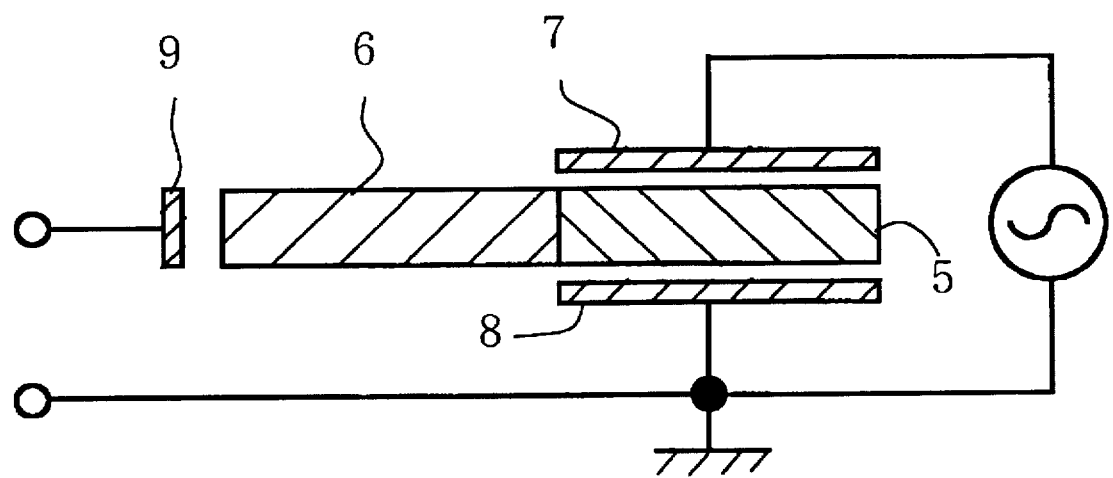
FIG. 2 is a view illustrating the conception of a booster.

FIG. 2 is a view schematically illustrating a configuration of the booster 2. The input electrodes 7, 8 are provided on both sides of the primary side piezoelectric element 5 in the thickness direction, and the output electrode 9 is provided on one end (on the side being not in contact with the primary side piezoelectric element 5) of the secondary side piezoelectric element 6 in the length direction.

In the booster 2, when an alternating current with the natural resonance frequency determined by the length direction of the primary side piezoelectric element 5 and the secondary side piezoelectric element 6 is applied to the input electrodes 7, 8 as a primary voltage, a strong mechanical vibration is generated in the length direction by an electrostrictive effect, and a secondary high voltage re-converted from the mechanical vibration is outputted from the output electrode 9.

At this time, the secondary voltage, which is determined depending on an impedance ratio between the primary side and the secondary side, can be boosted up to a sufficient value for spark discharge. For example, the secondary side can be set at a value between 10 to 12 KV when the primary side is set at 12 V.

The primary voltage generator 1 generates such a primary voltage, and more specifically, it generates an alternating current with the natural resonance frequency or a primary voltage with a component waveform thereof (as described later).

Figure 3:
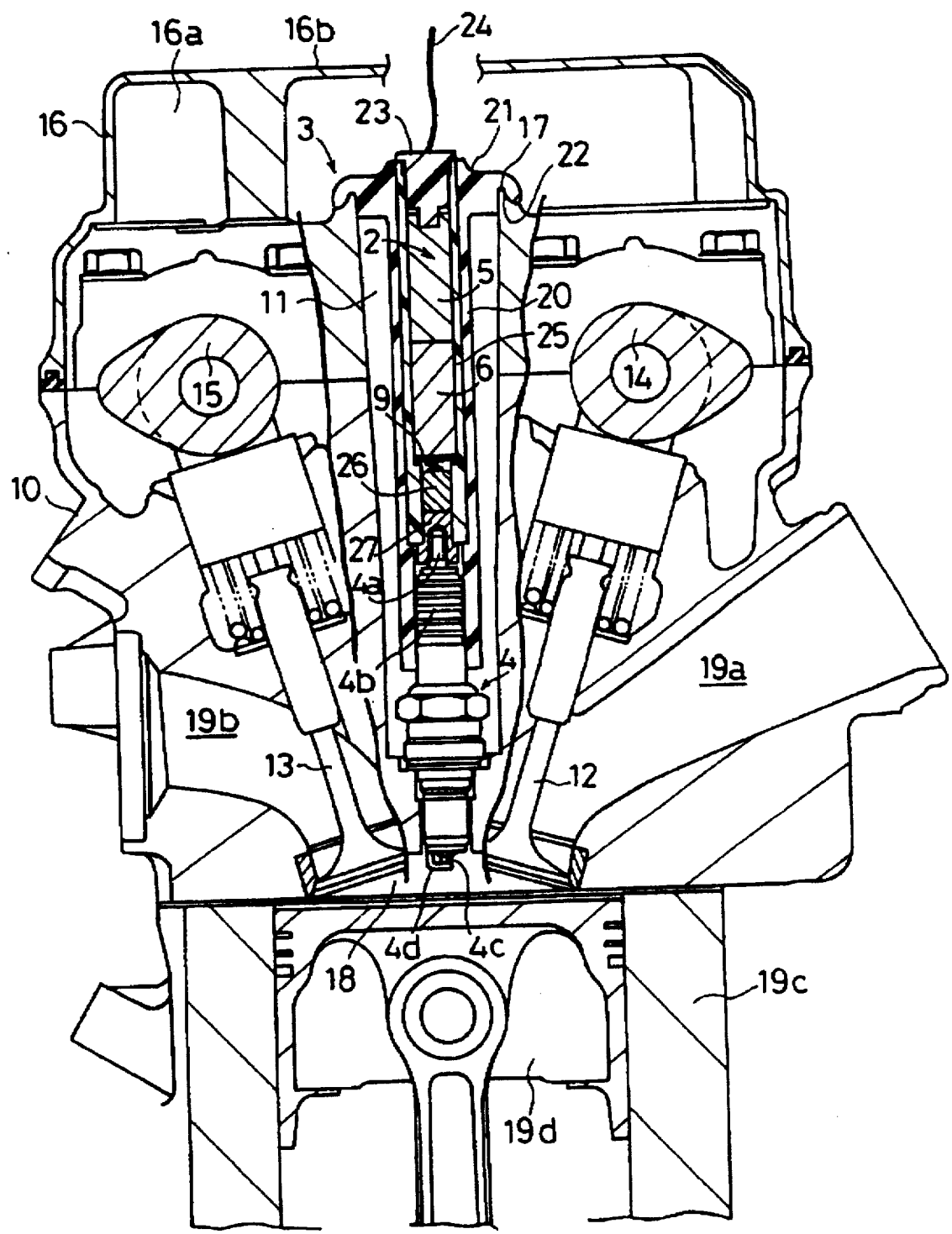
FIG. 3 is a sectional view illustrating a concrete application example.

FIG. 3 shows a configuration of the ignition system applied to a DOHC type engine for a motor-bicycle. A deep plug hole 11 is formed in the center portion of a cylinder head 10; an intake valve 12 and an exhaust valve 13 are provided in such a manner as to put the plug hole 11 therebetween; and a pair of camshafts 14, 15 for driving the valves 12, 13 are provided. These parts are covered with a cam cover 16.

The plug cap 3 has a cylindrical main body 20 formed of an insulating material excellent in heat resistance and elasticity. A flange portion 21 is formed at one end of the main body 20.

The flange portion 21 is positioned in such a manner that when the plug cap 3 is inserted in the plug hole 11, a groove portion 22 formed in the flange portion 21 is fitted with a projection 17 formed on the edge of the upper end opening of the plug hole 11.

Specifically, since the upper end opening of the plug hole 11 is formed in a recess 16a formed in the cam cover 16, the flange portion 21 positioned near the upper end opening of the plug hole 11 does not protrude from a maximum projecting portion 16b of the cam cover 16, with a result that the entire plug cap 3 is contained in the cam cover 16.

In addition, a heat-resisting rubber material is suitable as the insulating material of the main body 20.

A plug tap 23 is mounted at the central portion of the flange portion 21, and an electric wire 24 extends from the plug tap 23 and is connected to the primary voltage generator 1. The electric wire is different from the conventional high tension cord, and may be made of a material withstanding a low voltage, for example, about 100 to 200 V.

The booster 2 is contained in the main body 20 through a contact holder 25 made of a suitable heat-resisting/insulating resin such as phenol resin, and the output electrode 9 of the secondary side piezoelectric element 6 is connected to a cap electrode 27 provided at the leading end of the contact holder 25 through a spring-biased contact piece 26.

The cap electrode 27 is conducted to a connecting terminal 4a of the spark plug 4, and an insulating portion 4b of the spark plug 4 is covered with the lower end portion of the main body 20.

The spark plug 4 generates a spark discharge in a discharge gap formed between a center electrode 4c projecting in a combustion chamber 18 and a ground electrode 4d, to burn a fuel in the combustion chamber 18.

It is to be noted that in the figure, reference numeral 19a indicates an intake passage; 19b is an exhaust passage; 19c indicates a cylinder block; and 19d is a piston.

The booster 2 having the above configuration enables electric input as well as electric output, and consequently, it can eliminate the necessity of provision of a pressing means as the conventional mechanical inputting means and a distributor as the conventional distribution mechanism.

The booster 2 formed of the piezoelectric elements is also relatively small in size and weight, and thereby it can be integrally contained in the plug cap 3 and can eliminate the necessity of provision of the conventional high tension cord.

This is effective to make small in size and weight of the entire system with a simple structure, resulting in the reduced cost.

In particular, even when the system is used for a DOHC type engine as shown in FIG. 3, the small sized plug cap 3 does not protrude from the cam cover 16 to the outside and is compactly contained in the cam cover 16.

As a result, the small sized plug cap 3 can be substantially inserted and mounted, without a limitation in layout of the engine, even in the plug hole 11 which is relatively small in diameter because of the small angle between the intake valve 12 and the exhaust valve 13, that is, the small valve included angle and the small interval between a pair of the camshafts 14, 15.

In addition, although the plug cap 3 in the plug hole 11 is exposed to high-temperature heat and vibration of the engine, the booster 2 can be effectively protected from the high-temperature heat and vibration because the main body 20 is made of an insulating material excellent in heat resistance and elasticity.

Consequently, even when the system is mounted on a small sized internal combustion engine of a motor-bicycle, it is mounted in a simple layout, and is optimized in structure for ignition control by the primary voltage generating means 1 of an electronic control type.

FIG. 4 is a view illustrating the conception of another embodiment of the ignition system of the present invention, in which a booster is integrated with a spark plug. A booster integrated spark plug 4 includes in an insulating portion 4b a booster 2 having the same structure as that shown in FIG. 1. Input electrodes 7, 8 of the booster 2 are connected to a primary voltage generator 1 through a cord 24.

An output electrode 9 of the booster 2 is connected to a center electrode 4c of the spark plug 4 for generating a spark discharge in a discharge gap 4e formed between the center electrode 4c and a ground electrode 4d by a secondary voltage.

In this way, the booster 2 can be contained in the spark plug 4. The system of this type can eliminate the necessity of provision of the plug cap, and thereby makes it possible to make further smaller the size and weight as a whole with a simple structure.

Figure 5A:
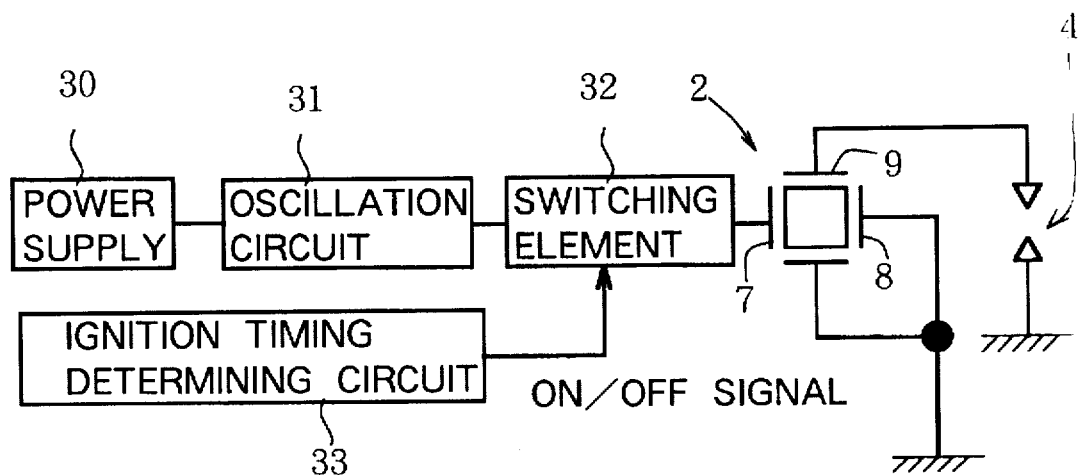
FIG. 5A is a circuit diagram of a first type of a primary voltage generating means.

The configuration of a circuit of the primary voltage generating means 1 will be described below. FIG. 5A shows a first type circuit of the primary voltage generator 1. In this figure, an oscillation circuit 31 and a switching element 32 are connected in series between a suitable DC power supply 30 such as a battery and the booster 2. The switching element 32 is turned on/off by an ignition timing determining circuit 33.

The oscillation circuit 31 is adjusted to generate the natural resonance frequency of the booster 2, and the ignition timing determining circuit 33 turns on the switching element 32 at a specified timing. It is to be noted that a known pulser circuit or the like is used as the ignition timing determining circuit 33.

Figure 5B:
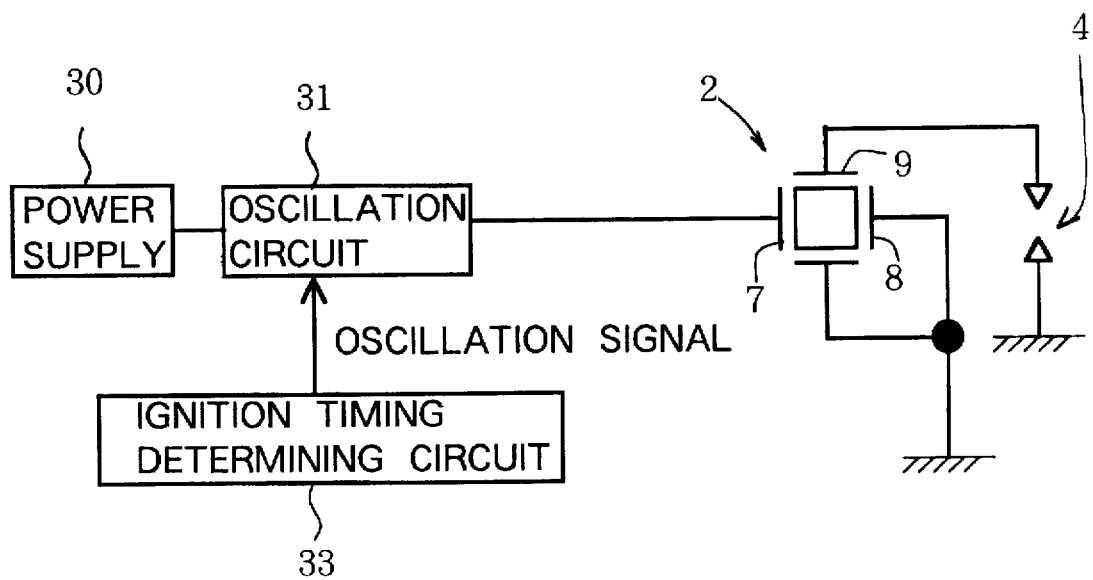
FIG. 5B is a circuit diagram of a modification of the first type.

The above circuit may be replaced with that shown in FIG. 5B. In this figure, the ignition timing determining circuit 33 is connected to the oscillation circuit 31 which is adjusted to generate the natural resonance frequency of the booster 2. The ignition timing determining circuit 33 gives, to the oscillation circuit 31, an oscillation signal for generating oscillation at a specified timing for a specified time. Such a circuit is satisfactory to obtain the same effect as the FIG. 5A circuit but with a simpler structure.

Figure 6:
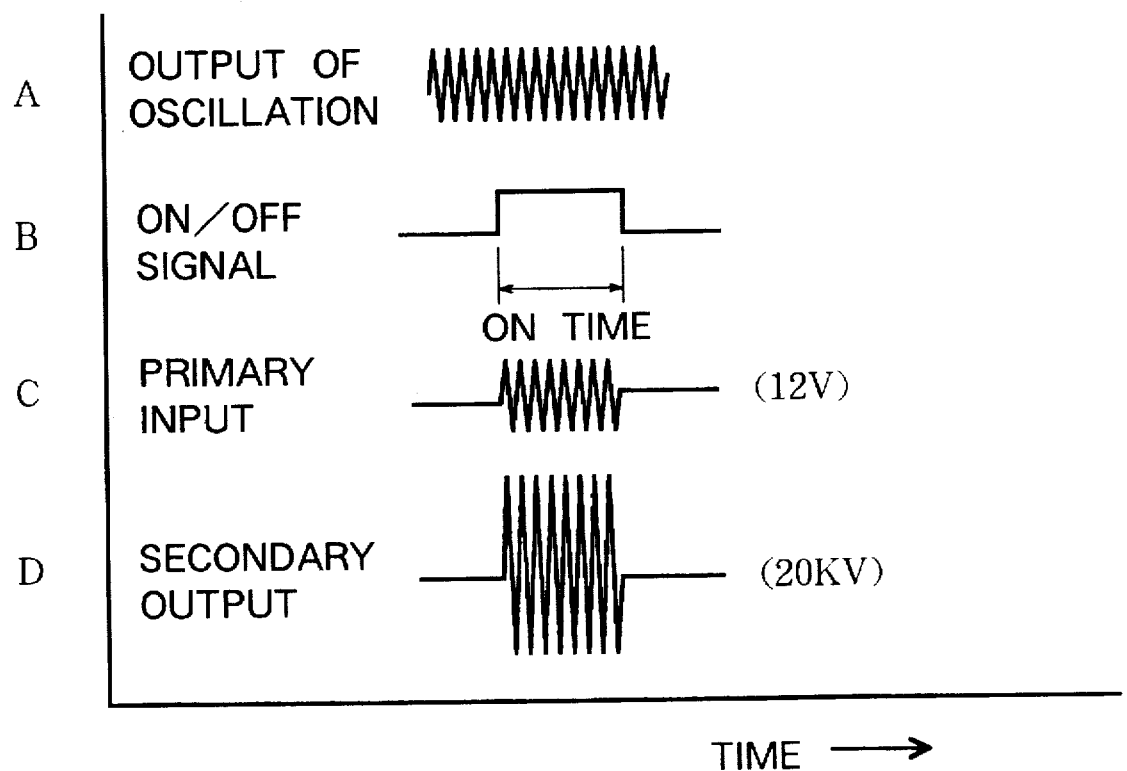
FIG. 6 is a diagram showing waveforms at respective portions of the circuit shown in FIG. 5A.

FIG. 6 shows output waveforms at respective portions in the circuit shown in FIG. 5A. The above high frequency alternating current having a waveform shown in "A" is outputted from the oscillation circuit 31; an ON signal having a waveform shown in "B" is outputted from the switching element 32 for a specified time; a primary voltage having a waveform shown in "C" is given by the output of the oscillation circuit for the on-time of the switching element 32; and a boosted secondary output having a waveform shown in "D" is obtained.

In this way, the output of the oscillation circuit 31 is applied to the booster 2 as a primary voltage during the on-state of the switching element 32, and thereby a secondary output can be obtained only for the applying time. As a result, a discharge time at the spark plug 4 is made longer, enabling a strong spark ignition.

Figure 7:
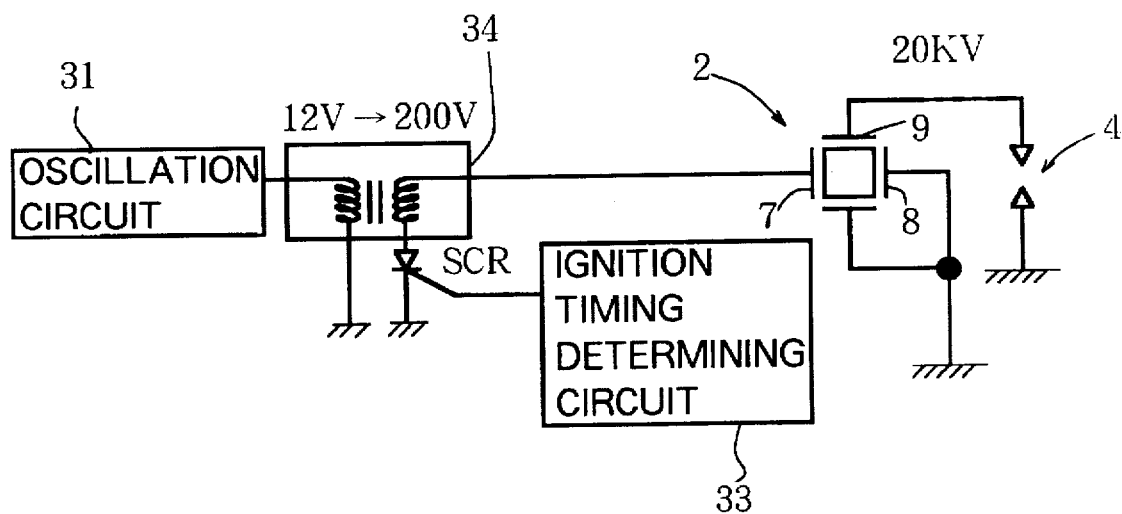
FIG. 7 is a circuit diagram of a further modification of the first type.

FIG. 7 shows a further modification of the above first type circuit in which a thyrister SCR is used as the switching element 32. In this case, a small sized transducer 34 is connected in series between the oscillation circuit 31 and the booster 2, and the thyrister SCR is connected in the forward direction between the secondary side coil of the transducer 34 and the ground. The ignition timing determining circuit 33 is connected to a gate of the thyrister SCR.

The transducer 34 is very small in size and is adapted to boost a voltage of 12 V supplied from the power supply to a value between about 100 to 200 V. In addition, the thyrister SCR is disposed near the ground for stabilizing a gate voltage.

It is to be noted that the existing oscillation circuit portion for obtaining a specified primary voltage by boosting a battery power supply using a DC-DC converter in a CDI system (described later) can be used for the circuit portion extending from the thyrister SCR and the power supply side.

Figure 8:
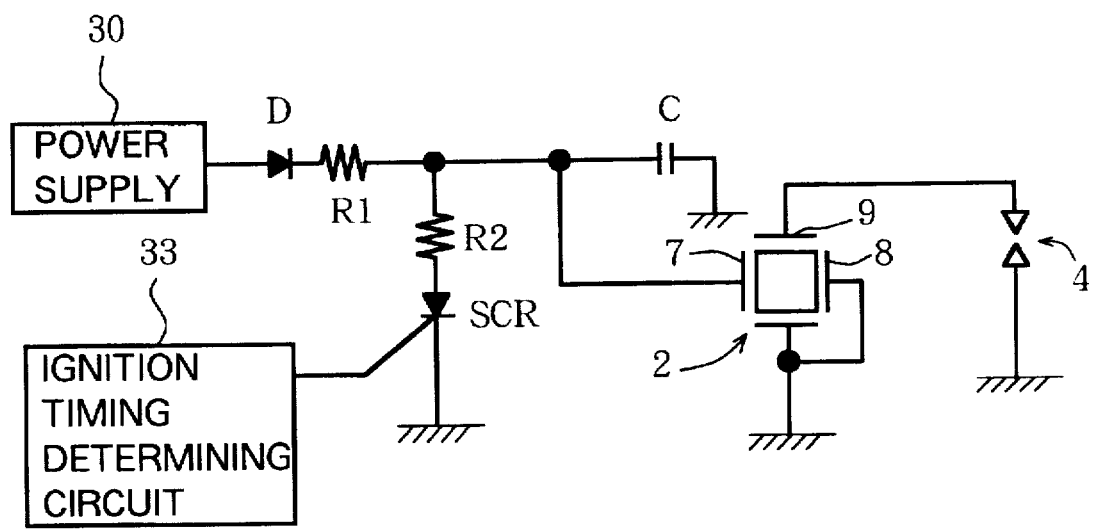
FIG. 8 is a circuit diagram of a second type of the primary voltage generating means.

FIG. 8 shows a second type circuit of the primary voltage generating means 1. This second type circuit omits the oscillation circuit 31 from the first type circuit and is combined with a conventional capacitor charge-discharge type circuit. Specifically, a resistor R1 is connected in series to a diode D which is connected to the power supply in the forward direction. A resistor R2, an ignition capacitor C and the booster 2 are connected in parallel between the resistor R1 and the ground. The resistor R2 is connected to an anode of the thyrister SCR; the ignition timing determining circuit 33 is connected to a gate of the thyrister SCR; and a cathode of the thyrister SCR is grounded.

In the booster 2, the input electrode 7 is connected to the resistor R1 and the output electrode 9 is connected to the spark plug 4. A charge circuit of the ignition capacitor C includes the diode D, resistor R1 and ignition capacitor C. The resistor R1 is used for realizing moderate charging. A discharge circuit of the ignition capacitor C includes the ignition capacitor C, thyrister SCR and resistor R2. The charge circuit and the discharge circuit are thus different from each other.

In the booster 2, each of the primary side piezoelectric element 5 and the secondary side piezoelectric element 6 is made of a dielectric and thus functions as a capacitor, so that the booster 2 performs charge/discharge together with the ignition capacitor C.

Figure 9:
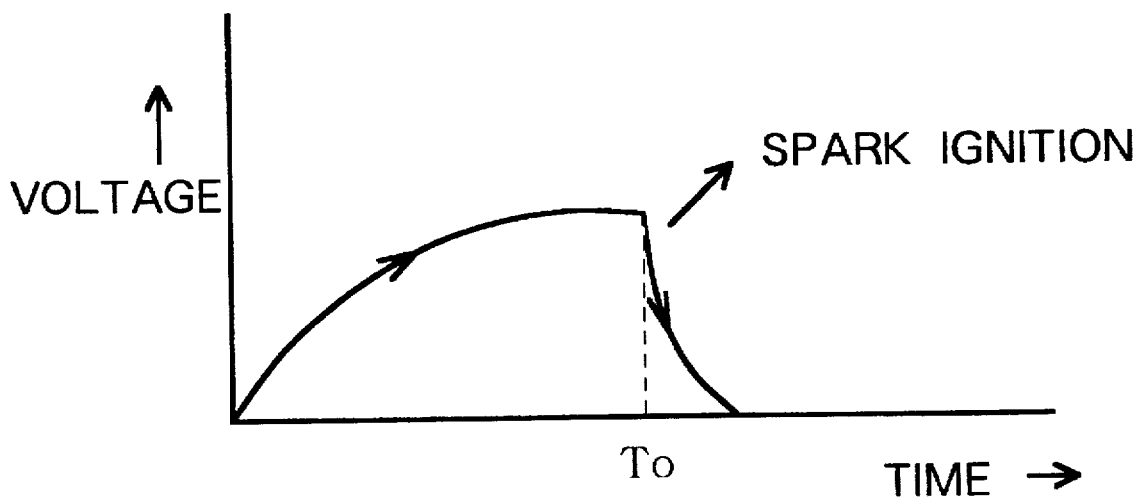
FIG. 9 is a diagram illustrating waveforms in the circuit shown in FIG. 8.

FIG. 9 shows a charge-discharge characteristic of the ignition capacitor C, wherein the abscissa indicates the time and the ordinate indicates the voltage of the ignition capacitor C. As is apparent from this figure, charging is performed relatively moderately. On the other hand, when the thyrister SCR is turned on by the ignition tinting determining circuit 33 and is triggered, the discharging is rapidly performed from the triggered point (T0).

Accordingly, by setting a time constant in the discharge circuit in such a manner that the falling waveform of a voltage upon discharge corresponds to a component waveform of the natural resonance frequency of the booster 2, it is possible to achieve the same effect as that obtained by applying an alternating current having the resonance frequency to the input electrodes 7, 8 of the booster 2 upon discharge. In addition, the time constant in the discharge circuit is determined by the ignition capacitor C, booster 2 and resistor R2.

Consequently, when charge is started in FIG. 8, the booster 2 is charged together with the ignition capacitor C, and accumulates electrostriction by the electrostrictive effect. After that, when the thyrister SCR is turned on by the ignition timing determining circuit 33, electric charges accumulated in the ignition capacitor C and the booster 2 are discharged through the resistor R2.

At this time, the electrostriction released in the booster 2 is the form of mechanical vibration which is converged while being attenuated. Moreover, since the time constant in the discharge circuit is determined in such a manner that the discharge waveform corresponds to the component of the resonance frequency of the booster 2, the amplitude at the beginning of vibration upon release becomes sufficiently large. For example, assuming that the amount of electrostriction upon charge is +A, the electrostriction at the beginning of vibration becomes near −A. A high voltage is generated at the output electrode 9 during the attenuated vibration, to generate a spark discharge.

The carrying direction of a current flowing in the discharge circuit is constant during a period from the start of discharge to ignition. Consequently, even when the thyrister SCR is used as the switching element, the thyrisiter SCR is not commutated until ignition. As a result, the thyrister being relatively low in cost can be used as the switching element.

In the third type circuit, since the oscillation circuit is omitted, a stability of frequency in the oscillation circuit is not required to be kept. In addition, the use of the thyrister SCR allows a pulse signal to be used as an ignition signal, and thereby a conventional pulser circuit can be used as the ignition timing determining circuit 33. This is effective to reduce the cost.

Moreover, since the booster 2 functions as a capacitor, the discharge amount corresponds to a sum of the charge amounts of the ignition capacitor C and the booster 2. This is effective to reduce the size of the ignition capacitor C.

Figure 10:
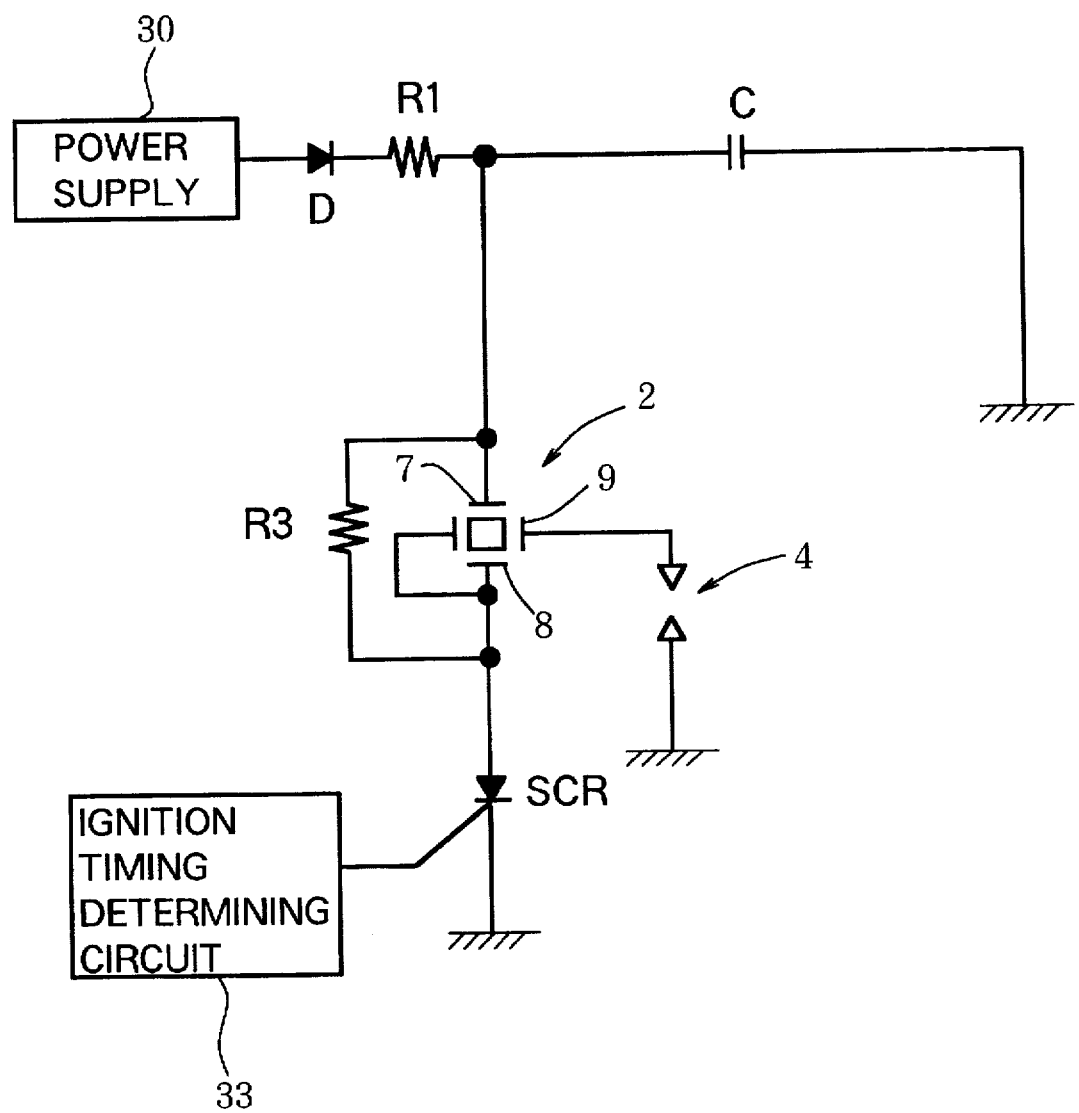
FIG. 10 is a circuit diagram of a third type of the primary voltage generating means.

FIG. 10 is a third type of circuit for the primary voltage generator 1, which is different from the second type shown in FIG. 8 in that the connected position of the thyrister SCR is changed. Specifically, a resistor R3 is connected in parallel to the booster 2, in place of the resistor R2. The thyrister SCR is connected in the forward direction between the ground and the connecting portion connecting the booster 2 to the resistor R3. The ignition timing determining circuit 33 is connected to the gate of the thyrister SCR. The values of the resistors R1 and R3 are suitably determined depending on the required time constant.

Figure 11:
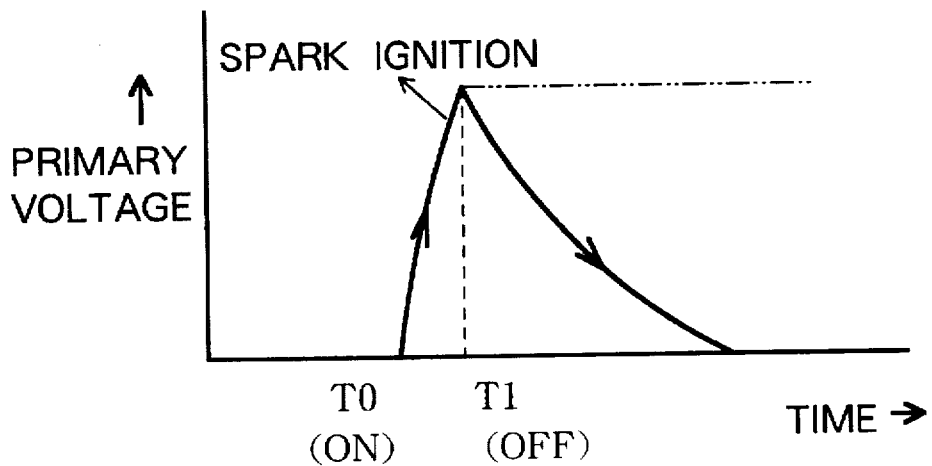
FIG. 11 is a diagram illustrating waveforms in the circuit shown in FIG. 10.

FIG. 11 is a graph showing a time change of a primary voltage of the booster 2 upon discharge of the ignition capacitor C, wherein the abscissa indicates the time and the ordinate indicates the primary voltage.

As is apparent from this figure, the ignition capacitor C is previously charged in the off state of the thyrister SCR, and when the thyrister SCR is turned on, a primary voltage applied to the input electrode 7 of the booster 2 is rapidly increased by the discharge of the ignition capacitor C from the triggered point (T0).

Accordingly, by setting the rising waveform of the primary voltage in such a manner as to correspond to the component waveform of the natural resonance frequency of the booster 2, it is possible to output a secondary voltage sufficiently high for ignition from the output electrode 9 of the booster 2.

In addition, as described above, since the booster 2 functions as a capacitor, vibration of the current is generated after ignition, and the thyrister SCR is automatically turned off by commutation, to cutoff the discharge circuit. At the same time, electrical charges accumulated in the input electrodes 7, 8 of the booster 2 are consumed through the resistor R3.

With this third type circuit, the same effect as that of the second type can be obtained, and the use of the mechanical vibration of the piezoelectric element is made easier as compared with the case using the attenuated vibration of the second type.

Figure 12:
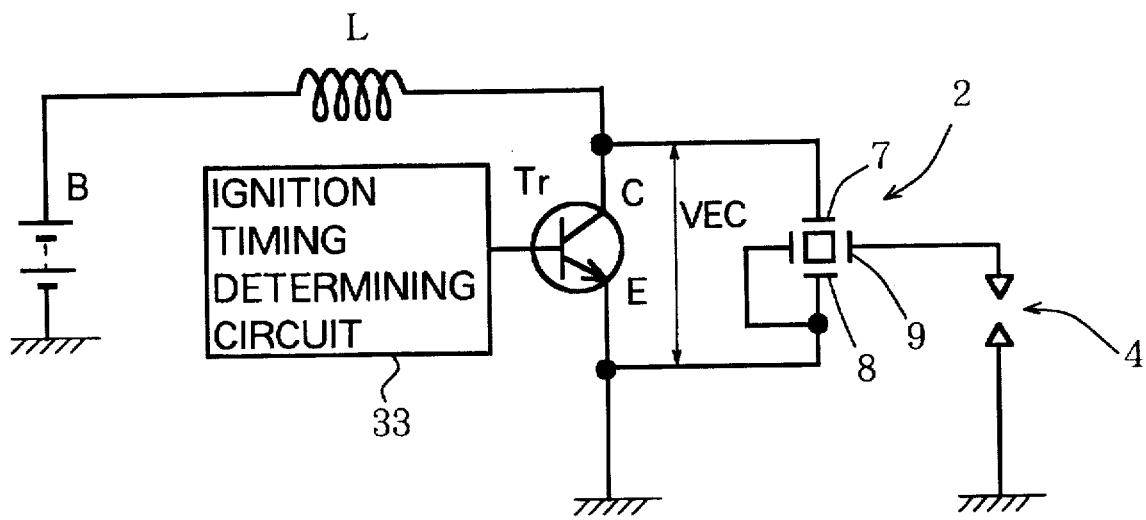
FIG. 12 is a circuit diagram of a fourth type of the primary voltage generating means.

FIG. 12 is a circuit using a battery ignition system, in which the switching element (transistor Tr) is connected to a battery B through a coil L, and the booster 2 is connected in parallel to the transistor Tr.

Figure 13:
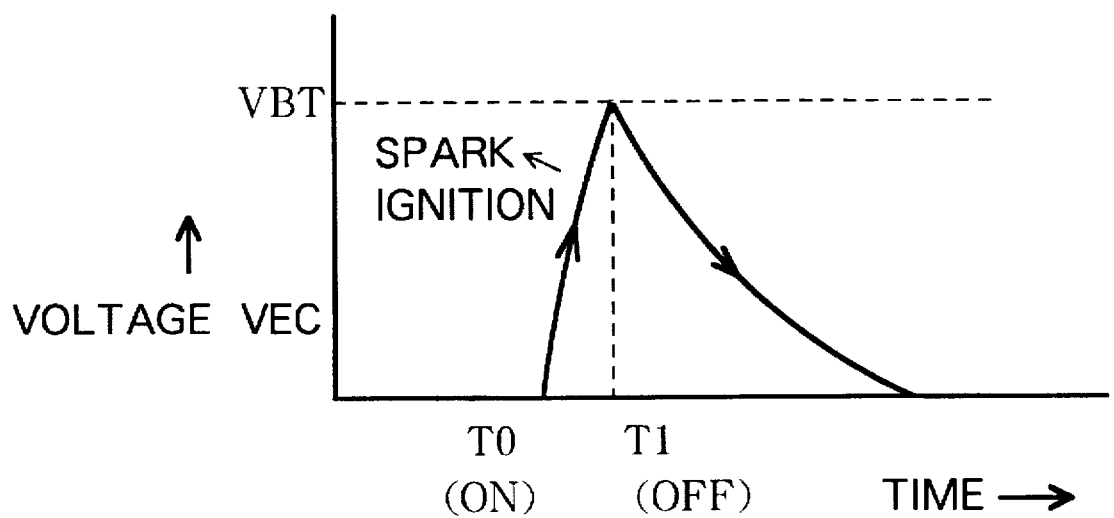
FIG. 13 is a diagram illustrating waveforms in the circuit shown in FIG. 12.

In this circuit, when the transistor Tr is turned on, a potential difference VEC between a collector C and an emitter E becomes zero, and when the transistor Tr is turned off, a voltage is increased up to the battery voltage VBT. Such a change is shown in FIG. 13, wherein the abscissa indicates the time and the ordinate indicates the potential difference VEC.

As is apparent from this figure, when the transistor Tr is turned off, the potential difference VEC is rapidly raised at the point (T0) and the discharge to the booster 2 is started. The rising waveform at this time is due to a time constant determined by the booster 2 and the circuit including the coil L and the battery B.

Accordingly, by predetermining the time constant of the charge circuit at a small value for allowing the rising waveform to correspond to the component waveform of the natural resonance frequency of the piezoelectric element constituting the booster 2, a secondary high voltage is outputted from the output electrode 9 when the potential difference VEC is raised by turn-off of the transistor Tr.

After that, when the transistor Tr is turned on, electric charges accumulated in the booster 2 are discharged through the transistor Tr from the point (T1), and the potential difference VEC is fallen. The falling waveform at this time is also determined by the time constant determined by the frequency of the transistor Tr and the booster 2 and also the base input waveform of the transistor Tr.

Accordingly, since the falling waveform can be relatively moderated by setting the time constant of the discharge circuit, the vibration of the booster 2 can be prevented. In addition, the discharge from the booster 2 can be also moderated by moderating the rising of the on-signal at the transistor Tr.

With this circuit, the same effect as those in the first and second types can be obtained, and further the bask configuration in a popular battery ignition type circuit can be used.

Industrial Applicability

As described above, the ignition system for an internal combustion engine according to the present invention is small in size and weight, and accordingly, it is suitable for an internal combustion engine of an automobile or a motorbicycle.

What is claimed is:

1. An ignition system for an internal combustion engine, comprising:

a booster including a piezoelectric transducer for generating a secondary high voltage by an electrostrictive effect of a piezoelectric element to which a primary voltage is applied;

a primary voltage generator generating a primary voltage for vibrating said piezoelectric element at its natural resonance frequency, wherein said booster is integrally disposed in a plug cap, and wherein said plug cap is insertable into a plug hole formed between a pair of parallel camshafts in a DOHC type internal combustion engine in such a manner as not to protrude from a cam cover.

2. The ignition system for an internal combustion engine according to claim 1, wherein said plug cap is made of an insulating material which is heat resistant and elastic.

3. The ignition system for an internal combustion engine according to claim 2, wherein said primary voltage generator includes an oscillation circuit connected to a power supply, and a switching element connected in series between said oscillation circuit and the primary side of said booster which is turned on/off by an ignition timing determining circuit; and an output frequency of said oscillation circuit is specified to correspond to the natural resonance frequency of said piezoelectric element.

4. An ignition system for an internal combustion engine, comprising:

a booster including a piezoelectric transducer for generating a secondary high voltage by an electrostrictive effect of a piezoelectric element to which a primary voltage is applied;

a primary voltage generator generating a primary voltage for vibrating said piezoelectric element at its natural resonance frequency said primary voltage generator including an oscillation circuit connected in series between a power supply and the primary side of said booster and adapted to generate a frequency corresponding to the natural resonance frequency of said piezoelectric element in said booster; and an ignition timing determining circuit for imparting, to said oscillation circuit, an oscillation signal for triggering oscillating operation of said oscillation circuit to generate oscillation at a specified timing for a specified time.

5. An ignition system for an internal combustion engine, comprising:

a booster including a piezoelectric transducer for generating a secondary high voltage by an electrostrictive effect of a piezoelectric element to which a primary voltage is applied;

a primary voltage generator generating a primary voltage for vibrating said piezoelectric element at its natural resonance frequency said primary voltage generator including an ignition capacitor connected to a power supply, said booster connected in parallel to said ignition capacitor, and a switching element provided in a discharge circuit of said ignition capacitor and turned on/off by an ignition timing determining circuit; and a time constant for determining a falling waveform of a voltage upon discharge in the discharge circuit of said ignition capacitor is determined in such a manner that the falling waveform corresponds to a component waveform of the natural resonance frequency of said piezoelectric element.

6. The ignition system for an internal combustion engine according to claim 1, said primary voltage generator including a charge circuit having a diode, a first resistor and said ignition capacitor connected in series with the power supply;

said discharge circuit including a second resistor connected is series with said switching element, said second resistor and said switching element being connected in parallel with said booster and said ignition capacitor.

7. The ignition system for an internal combustion engine according to claim 1, said switching element including a silicon controlled rectifier including a gate connected to said ignition timing determining circuit, a cathode connected to ground and an anode connected to the second resistor.

8. An ignition system for an internal combustion engine, comprising:

a booster including a piezoelectric transducer for generating a secondary high voltage by an electrostrictive effect of a piezoelectric element to which a primary voltage is applied;

a primary voltage generator generating a primary voltage for vibrating said piezoelectric element at its natural resonance frequency said primary voltage generator including an ignition capacitor connected to a power supply, a switching element forming a discharge circuit of said ignition capacitor and turned on/off by an ignition timing determining circuit, and said booster connected in series with said switching element and a grounding portion; and a time constant for determining a rising waveform of a primary voltage generated on the primary side of said booster upon discharge of said ignition capacitor is determined in such a manner that the rising waveform corresponds to a component waveform of the natural resonance frequency of said piezoelectric element.

9. The ignition system for an internal combustion engine according to claim 1, said primary voltage generator including a charge circuit including a diode, a first resistor and the ignition capacitor connected in series with the power supply; and said discharge circuit including a second resistor connected in parallel with said booster, said second resistor and said booster connected in series with said switching element.

10. The ignition system for an internal combustion engine according to claim 1, said switching element including a silicon controlled rectifier including a gate connected to said ignition timing determining circuit, a cathode connected to ground and an anode connected to the parallel connection of said second resistor and said booster.

11. An ignition system for an internal combustion engine, comprising:

a booster including a piezoelectric transducer for generating a secondary high voltage by an electrostrictive effect of a piezoelectric element to which a primary voltage is applied;

a primary voltage generator generating a primary voltage for vibrating said piezoelectric element at its natural resonance frequency said primary voltage generator including a switching element connected to a power supply and turned on/off by an ignition timing determining circuit, and said booster connected in parallel between two opened/closed terminals of said switching element; and a time constant for determining a rising waveform of a voltage between the two terminals when said switching element is turned off is determined in such a manner that the rising waveform corresponds to a component waveform of the natural resonance frequency of said piezoelectric element.

12. The ignition system for an internal combustion engine according to claim 11, said primary voltage generator including a battery and an inductor connected in series with said switching element.

13. The ignition system for an internal combustion engine according to claim 12, said switching element including a transistor having a base connected to said ignition timing determining circuit, wherein the terminals of said switching element include a collector connected to said inductor and a primary side of said booster and an emitter connected to ground.

* * * * *